(12) United States Patent
Cao et al.

(10) Patent No.: US 9,812,469 B2
(45) Date of Patent: Nov. 7, 2017

(54) ARRAY SUBSTRATE HAVING A PLURALITY OF GATE ELECTRODE MATERIAL LINES, SOURCE-DRAIN ELECTRODE MATERIAL LINES AND FIRST METAL LINES

(71) Applicant: BOE TECHNOLOGY GROUP CO., LTD., Beijing (CN)

(72) Inventors: Zhanfeng Cao, Beijing (CN); Feng Zhang, Beijing (CN); Bin Zhang, Beijing (CN); Xiaolong He, Beijing (CN); Jincheng Gao, Beijing (CN); Qi Yao, Beijing (CN); Zhengliang Li, Beijing (CN); Xiangchun Kong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/150,549

(22) Filed: May 10, 2016

(65) Prior Publication Data
US 2017/0005110 A1 Jan. 5, 2017

(30) Foreign Application Priority Data
Jul. 1, 2015 (CN) .......................... 2015 1 0379820

(51) Int. Cl.
*H01L 27/12* (2006.01)
*H01L 29/423* (2006.01)
*H01L 29/417* (2006.01)

(52) U.S. Cl.
CPC ...... *H01L 27/124* (2013.01); *H01L 29/41733* (2013.01); *H01L 29/42384* (2013.01)

(58) Field of Classification Search
CPC .................. H01L 29/41758; H01L 27/124
See application file for complete search history.

(56) References Cited

U.S. PATENT DOCUMENTS

2016/0351585 A1\* 12/2016 Cao ...................... H01L 27/124

\* cited by examiner

*Primary Examiner* — Hoai V Pham
(74) *Attorney, Agent, or Firm* — Collard & Roe, P.C.

(57) ABSTRACT

An array substrate and a display device are disclosed. The array substrate includes a peripheral area in which a plurality of gate electrode material lines, a plurality of source-drain electrode material lines and a plurality of first metal lines are disposed. Overlapping areas are provided between or among the gate electrode material lines, the source-drain material lines and the first metal lines; a number of the overlapping areas of the source-drain material lines and the first metal lines is less than a number of the overlapping areas of the source-drain material lines and the gate electrode material lines; the gate electrode material lines, the source-drain material lines and the first metal lines are configured as connecting lines of circuits in the peripheral area.

20 Claims, 3 Drawing Sheets

A-A'

ARRAY SUBSTRATE HAVING A PLURALITY OF GATE ELECTRODE MATERIAL LINES, SOURCE-DRAIN ELECTRODE MATERIAL LINES AND FIRST METAL LINES

CROSS REFERENCE TO RELATED APPLICATIONS

Applicant claims priority under 35 U.S.C. §119 of Chinese Application No. 201510379820.0 filed on Jul. 1, 2015, the disclosure of which is incorporated by reference.

TECHNICAL FIELD

Embodiments of the present disclosure relates to an array substrate and a display device.

BACKGROUND

Gate Driver on Array (GOA) circuit technology is such a circuit technology that a gate driving integrated circuit is integrated into a peripheral area of an array substrate of a display device. GOA circuit technology can reduce the size of the frame of a display device and can reduce cost in both material and the process.

SUMMARY

An embodiment of the present disclosure provides an array substrate comprising a peripheral area in which a plurality of gate electrode material lines, a plurality of source-drain electrode material lines and a plurality of first metal lines are disposed. Overlapping areas are provided between or among the gate electrode material lines, the source-drain material lines and the first metal lines; a number of the overlapping areas of the source-drain material lines and the first metal lines is less than a number of the overlapping areas of the source-drain material lines and the gate electrode material lines; the gate electrode material lines, the source-drain material lines and the first metal lines are configured as connecting lines of circuits in the peripheral area.

Besides, an embodiment of the present disclosure further provides a display device comprising the array substrate according to an embodiment mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure; and those skilled in the art can obtain other drawings according to these drawings, without any creative work.

REFERENCE NUMERAL

1—gate electrode material line; 2—source-drain electrode material line; 3—first metal line; 4—gate insulation layer; 5—passivation layer; 6—thin film transistor

DETAILED DESCRIPTION

Figure 1:
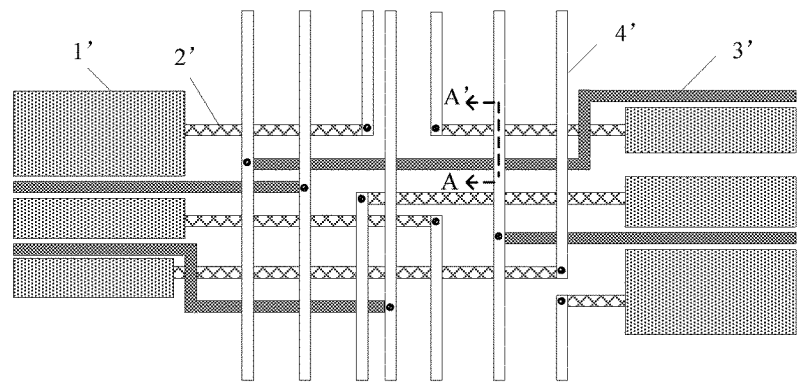
FIG. 1 is a schematic view of a part of a peripheral area of an array substrate.
Figure 2:
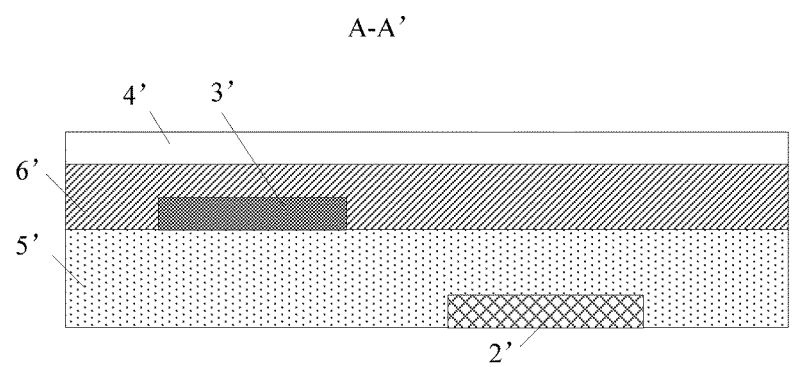
FIG. 2 is a cross section schematic view taken along the line AA' in FIG. 1.

As shown in FIG. 1 and FIG. 2, a GOA circuit of an array substrate of a display device comprises a plurality of thin film transistors 1' and gate electrode material lines 2', source-drain electrode material lines 3' and first metal lines 4', which are disposed between the thin film transistors 1'. The gate electrode material lines 2' are made of the same material as the gate lines or gate electrodes of the array substrate, and the source-drain electrode material lines 3' are made of the same material as the source electrodes or drain electrodes of the thin film transistors of the array substrate. A gate insulation layer 5' is disposed between the gate electrode material lines 2' and the source-drain electrode material lines 3' to insulate one from the other; and a passivation layer 6' is disposed between the source-drain electrode material lines 3' and the first metal lines 4' to insulate one from the other. The gate electrode material lines 2' extend along a direction which is parallel to a direction along which the source-drain electrode material lines 3' extend; the first metal lines 4' extend along a direction which is perpendicular to the direction along which the gate electrode material lines 2' and the source-drain electrode material lines 3' extend. The first metal lines 4' are electrically connected with the gate electrode material lines 2' or the source-drain electrode material lines 3' through the via holes formed within the gate insulation layer 5' and/or the passivation layer 6'.

In research, the inventors have noted that because the thickness of the passivation layer 6' is usually about 2000 Å, an electro-static breakdown is prone to occur at a location where the first metal line 4' crosses the source-drain electrode material line 3', and thus the electro-static breakdown is probable to occur between the lines disposed in the peripheral area of the array substrate. If the thickness of the passivation layer 6' is increased to reduce the probability of the electro-static breakdown, in the process of etching the passivation layer 6' and the gate insulation layer 5' together, the metal layer for forming drain electrodes and source electrodes are over etched because the etching time period is lengthened; and further because a via hole between a first metal line 4' and a source-drain electrode material line 3' becomes too deep and the via hole in the passivation layer 6' and the via hole in the resin layer that is disposed overlying the passivation layer 6' are connected together to form a via hole in a manner of half-lapping, which results in poor connection between the upper via hole and the lower via hole. Therefore, the probability of the electro-static breakdown between the lines disposed in the peripheral area of the array substrate can not be reduced through simply increasing the thickness of the passivation layer 6'.

Embodiments of the present disclosure provide an array substrate and a display device which can reduce the probability of the electro-static breakdown between the lines disposed in the peripheral area of the array substrate.

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 3A:
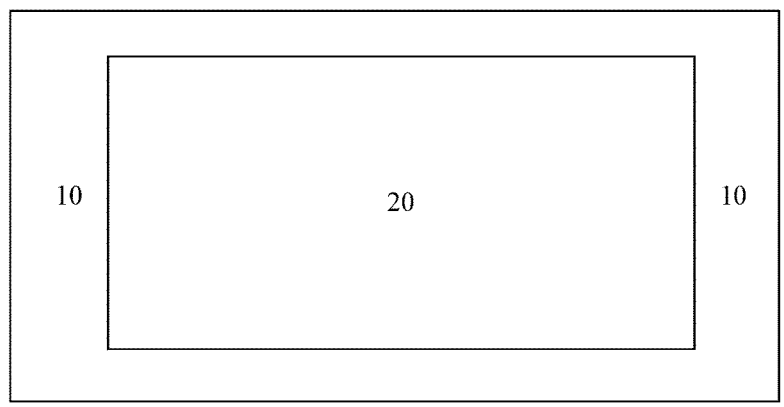
FIG. 3A is a schematic view of an array substrate.
Figure 3B:
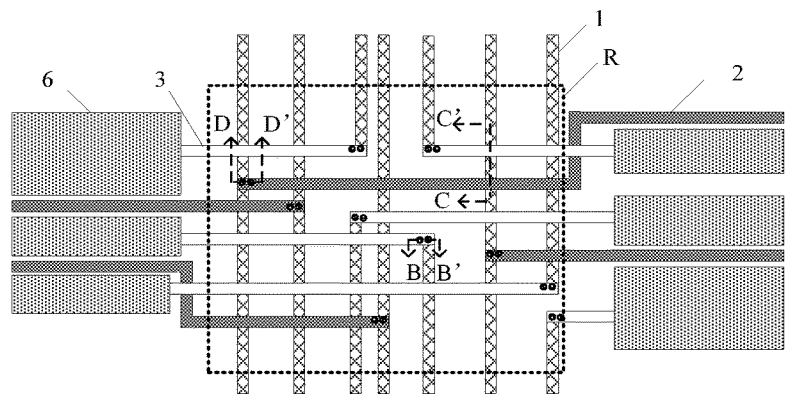
FIG. 3B is a schematic view of a part of a peripheral area of an array substrate according to an embodiment of the present disclosure.

An embodiment of the present disclosure provides an array substrate for a display device for example. As shown in FIG. 3A, the array substrate comprises an array area 20 (for example, a display area including sub-pixels) and a peripheral area 10; the peripheral area 10, for instance, surrounds the array area 20 or is disposed at one side or sides of the array area 10, for disposing circuit structures such as pads of gate lines, pad of data lines, pad of common electrodes and the like, which provide scanning signals and data signals for the array area for operation of displaying. As shown in FIG. 3B, a plurality of gate electrode material lines 1, a plurality of source-drain electrode material lines 2 and a plurality of first metal lines 3 are disposed in the peripheral area of the array substrate. Overlapping areas are provided between or among the gate electrode material lines 1, the source-drain material lines 2 and the first metal lines 3, such as between the gate electrode material lines 1 and the first metal lines 3 or between the source-drain material lines 2 and the first metal lines 3; the number of the overlapping areas of the source-drain material lines 2 and the first metal lines 3 is less than the number of the overlapping areas of the source-drain material lines 2 and the gate electrode material lines 1; the gate electrode material lines 1, the source-drain material lines 2 and the first metal lines 3 are configured as connecting lines of a circuit in the peripheral area. For example, the gate electrode material lines 1 are made of the same material as the gate lines or gate electrodes of the array substrate, and the source-drain electrode material lines 2 are made of the same material as the source electrodes or drain electrodes of the thin film transistors of the array substrate. The thin film transistors of the array substrate include the thin film transistors functioning as switch elements in the sub-pixels. In the present disclosure, two kinds of lines have an overlapping area therebetween refers to that the orthographic projections of these two kinds of lines on the surface of the array substrate have intersection therebetween.

At least one insulation layer is disposed between the gate electrode material lines 1 and the source-drain material lines 2. For example, a gate insulation layer is disposed between the gate electrode material lines 1 and the source-drain material lines 2; the thickness of the gate insulation layer is usually greater than 2000 Å, and thus electro-static breakdown will not occur in the overlapping area between a gate electrode material line 1 and a source-drain material line 2. At least two insulation layers are disposed between the gate electrode material lines 1 and the first metal lines 3. For example, a gate insulation layer and a passivation layer are disposed between the gate electrode material lines 1 and the first metal lines 3, thus electro-static breakdown will not occur in the overlapping area between a gate electrode material line 1 and a first metal line 3. Although the thickness of the insulation layer between the source-drain material lines 2 and the first metal lines 3 may be the same as the thickness in the technical solution as shown in FIG. 1, the number of the overlapping areas of the source-drain material lines 2 and the first metal lines 3 is less than the number of the overlapping areas of the source-drain material lines 2 and the gate electrode material lines 1 (the location of the gate electrode material lines 1 may be the same as the location of the first metal lines 1' in the technical solution as shown in FIG. 1), and thus compared with the technical solution as shown in FIG. 1, less or even no overlapping areas exist between the source-drain material lines 2 and the first metal lines 3; therefore, the probability of the electro-static breakdown between the lines disposed in the peripheral area of the array substrate can be reduced.

In the embodiment mentioned above, as shown in FIG. 3B and FIG. 4, the peripheral area comprises a main routing area R, which is indicated with the dotted line box; in the main routing area R, the source-drain material lines 2 and the first metal lines 3 do not have any overlapping area therebetween; and the gate electrode material lines 1 have overlapping areas with the source-drain material lines 2 as well as the first metal lines 3. Because in the main routing area R, the source-drain material lines 2 and the first metal lines 3 do not have any overlapping area therebetween, no electro-static breakdown will occur in the main routing area R.

Furthermore, in the main routing area R, the source-drain material lines 2 extend along a direction which is parallel to a direction along which the first metal lines 3 extend; the gate electrode material lines 1 extend along a direction which is perpendicular to the direction along which the source-drain material lines 2 and the first metal lines 3 extend. This configuration can make no overlapping area exist between the source-drain material lines 2 and the first metal lines 3, and can further reduce the probability of the electro-static breakdown between the lines disposed in the peripheral area of the array substrate. It should be noted that the directions along which the lines extend being parallel with or perpendicular to each other, which is mentioned above, does not mean that the lines must be straight lines, and the lines can be fold lines which extends along a direction as a whole.

Figure 4:
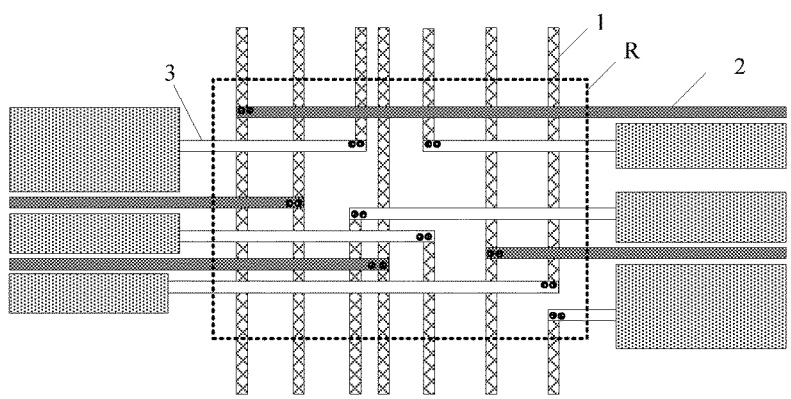
FIG. 4 is a schematic view of a part of a peripheral area of another array substrate according to an embodiment of the present disclosure.

It should be noted that, as shown in FIG. 3B and FIG. 4, in order to make the number of the overlapping areas of the source-drain material lines 2 and the first metal lines 3 be less than the number of the overlapping areas of the source-drain material lines 2 and the gate electrode material lines 1, there are two examples that are described as follows.

The first example is shown in FIG. 3B. In the rest routing area of the peripheral area, the source-drain material lines 2 and the first metal lines 3 have at least an overlapping area; in the example as shown in FIG. 3B, the overlapping areas between the source-drain material lines 2 and the first metal lines 3 are located outside of the outermost gate electrode material line 1 on either side, and therefore outside of the main routing area R. Because the total number of the overlapping areas between the source-drain material lines 2 and the first metal lines 3 is much less than the total number of overlapping areas of the source-drain material lines and the first metal lines in the technical solution, in which a electro-static breakdown is prone to occur, as shown in FIG. 1, compared with the technical solution as shown in FIG. 1, even if the thickness of the insulation layer between the source-drain material lines 2 and the first metal lines 3 is the same, the total number of the overlapping areas is much reduced, and thus the probability of the electro-static breakdown between the lines disposed in the peripheral area of the array substrate can be reduced.

The second example is shown in FIG. 4. In the rest routing area of the peripheral area, no overlapping area exists between the source-drain material lines 2 and the first metal lines 3. Specifically, the electrically connecting position(s) between the source-drain material lines 2 and the gate electrode material lines 1 is modified to realize the arrangement in which no overlapping area exists between the source-drain material lines 2 and the first metal lines 3. For example, the source-drain material lines 2 and the first metal lines 3 are parallel to each other, and therefore there are no overlapping areas between the source-drain material lines 2 and the first metal lines 3.

Because no overlapping area exists between the source-drain material lines 2 and the first metal lines 3, electro-static breakdown will not occur between the source-drain material lines 2 and the first metal lines 3, and thus electro-static breakdown will not occur between the lines disposed in the peripheral area of the array substrate. Therefore, the configuration of the source-drain material lines 2 and the first metal lines 3 in the second example is more simple and easy for preparing so as to be configured as the structure of the source-drain material 2 and the first metal lines 3 in embodiments of the present disclosure.

Figure 5:
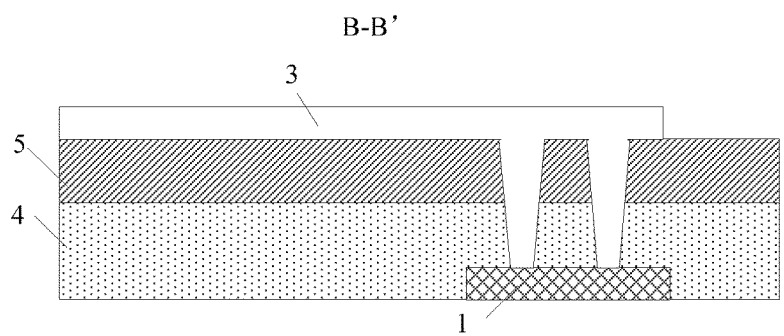
FIG. 5 is a cross section schematic view taken along the line BB' in FIG. 3B.

Further, as shown in FIG. 5, a gate insulation layer 4 and a passivation layer 5 are disposed in the peripheral area of the array substrate; the gate insulation layer 4 and the passivation layer 5 are disposed between a gate routing layer in which gate electrode material lines 1 are disposed and a metal routing layer in which the first metal lines 3 are disposed. Because only one gate insulation layer 4 and one passivation layer 5 are disposed in the peripheral area of the array substrate, the manufacturing cost is saved while the probability of the electro-static breakdown between the lines disposed in the peripheral area of the array substrate is reduced.

Figure 6:
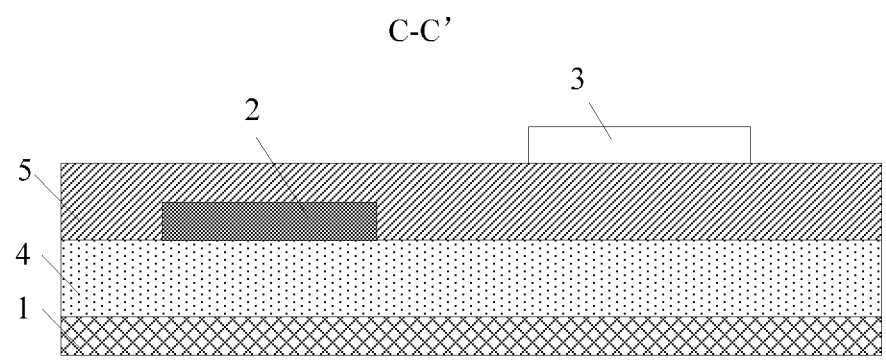
FIG. 6 is a cross section schematic view taken along the line CC' in FIG. 3B.

Further, as shown in FIG. 6, the gate insulation layer 4 is disposed between the gate routing layer in which gate electrode material lines 1 are disposed and a source-drain routing layer in which the source-drain material lines 2 are disposed. Because only one gate insulation layer 4 is disposed in the peripheral area of the array substrate, the manufacturing cost is saved while the probability of the electro-static breakdown between the lines disposed in the peripheral area is reduced.

Optionally, the thickness of the gate insulation layer 4 is 3000-5000 Å, and the thickness of the passivation layer 5 is 1500-2500 Å. For example, the thickness of the gate insulation layer 4 is 4000 Å, and the thickness of the passivation layer 5 is 2000 Å. Because it is not necessary to increase the thickness of the passivation layer 5 to reduce the probability of the electro-static breakdown between the lines disposed in the peripheral area of the array substrate, the manufacturing cost is saved.

Further, as shown in FIG. 3B and FIG. 4, the gate electrode material lines 1 are connected with the source-drain electrode material lines 2 or with the first metal lines 3. The gate electrode material lines 1, the source-drain electrode material lines 2 and the first metal lines 3 can be configured to transmit gate line driving signals, data line driving signals and other signals. The source-drain electrode material lines 2 and the first metal lines 3 can transmit same signals or different signals.

As shown in FIG. 3B or FIG. 5, a via hole is formed in the gate insulation layer 4 and the passivation layer 5; a gate electrode material line 1 and a first metal line 3 are electrically connected through the via hole. Preferably, two via holes are formed in the gate insulation layer 4 and the passivation layer 5, which can together allow the electrically connection between the gate electrode material line 1 and the first metal line 3 become more stable.

Figure 7:
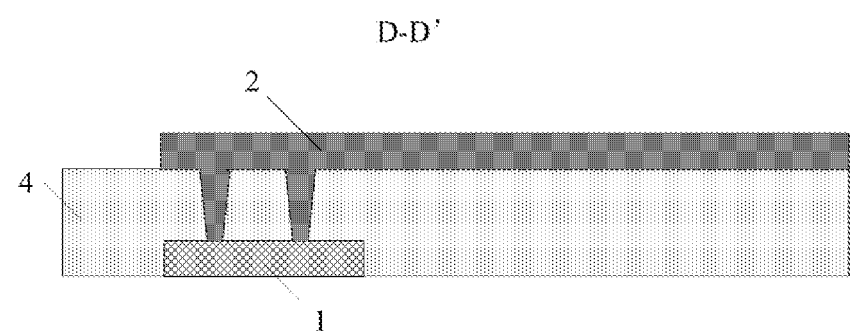
FIG. 7 is a cross section schematic view taken along the line DD' in FIG. 3B.

In addition, as shown in FIG. 3B and FIG. 7, a via hole is formed in the gate insulation layer 4, and a gate electrode material line 1 and a source-drain electrode material line 2 are electrically connected through the via hole. Preferably, two via holes are formed in the gate insulation layer 4, which can allow the electrically connection of the gate electrode material line 1 and the source-drain electrode material line 2 become more stable.

Further, as shown in FIG. 3B, thin film transistors 6 are further disposed in the peripheral area of the array substrate; the first metal lines 3 can be electrically connected with gate electrodes, source electrodes or drain electrodes of the thin film transistors 6. For example, as shown in FIG. 3B, the gate electrode material lines 1, the source-drain electrode material lines 2 and the first metal lines 3 are arranged between the thin film transistors 6 that are disposed opposite to each other.

A via hole can be formed in the gate insulation layer 4 and the passivation layer 5, and the first metal line 3 and the gate electrode of the thin film transistor 6 can be electrically connected with each other through the via hole. The related portion in the present application can be referred to for providing the via hole, which is not repeated herein. A via hole can be formed in the passivation layer 5, and the first metal line 3 and the source electrode or the drain electrode of the thin film transistor 6 can be electrically connected with each other through the via hole.

Further, for example, a common electrode and a conducting structure which is disposed above the common electrode are disposed in a display area of the array substrate; the conducting structure is electrically connected with the common electrode for example in parallel, thus the resistance of the common electrode can be reduced. Besides, the conducting structure and the first metal lines 3 may be disposed in a same layer and are formed in a same process, thus the process of manufacturing the array substrate can be simplified.

In addition, it should be noted that a gate line, a data line, a thin film transistor, a pixel electrode, a gate insulation layer and a passivation layer may be further disposed in the display area of the array substrate. The thin film transistor includes a gate electrode, a source electrode and a drain electrode; the gate electrode and the gate electrode material line 1 are disposed in a same layer and are formed in a same process; the source electrode, the drain electrode and the source-drain electrode material line 2 are disposed in a same layer and are formed in a same process; the gate insulation layer in the display area and the gate insulation layer 4 in the peripheral area of the array substrate are disposed in a same layer and are formed in a same process; and the passivation layer in the display area and the passivation layer 5 in the peripheral area of the array substrate are disposed in a same layer and are formed in a same process, thus the process of manufacturing the array substrate can be simplified.

In an array substrate according to any one of the embodiments mentioned above, because at least one relatively thicker gate insulation layer is disposed between the gate electrode material lines and the source-drain material lines, and thus electro-static breakdown will not occur in the overlapping area of the gate electrode material lines and the source-drain material lines; at least two insulation layers are disposed between the gate electrode material lines and the first metal lines, thus electro-static breakdown will not occur in the overlapping area of the gate electrode material lines and the first metal lines; and although the thickness of the insulation layer between the source-drain material lines and the first metal lines is same as the thickness in the configuration as shown in FIG. 1, the number of the overlapping areas between the source-drain material lines and the first metal lines is less than the number of the overlapping areas of the source-drain material lines and the gate electrode material lines (the location of the layer of the gate electrode material lines is same as the location of the layer of the first metal lines in the configuration as shown in FIG. 1 for example), and thus compared with the configuration as shown in FIG. 1, less or no overlapping area exists between the source-drain material lines and the first metal lines; therefore, the probability of the electro-static breakdown between the lines disposed in the peripheral area of the array substrate can be reduced.

In addition, an embodiment of the present disclosure provides a display device comprising the array substrate according to any one of the embodiments of the present disclosure. The display device can have a feature of narrow frame, and the display device can be any product or component having a display function such as display panel, tablet computer, television, display screen, laptop computer or the like.

What are described above is related to the illustrative embodiments of the disclosure only and not limitative to the scope of the disclosure, any various changes or replacement within the scope of the disclosure, which can be easily thought out by those skilled in the art, should be included within the scope of the present invention. Therefore, the scopes of the disclosure are defined by the accompanying claims.

What is claimed is:

1. An array substrate comprising a peripheral area in which a plurality of gate electrode material lines, a plurality of source-drain electrode material lines and a plurality of first metal lines are disposed, wherein, overlapping areas are provided between or among the gate electrode material lines, the source-drain material lines and the first metal lines; a number of the overlapping areas of the source-drain material lines and the first metal lines is less than a number of the overlapping areas of the source-drain material lines and the gate electrode material lines; the gate electrode material lines, the source-drain material lines and the first metal lines are configured as connecting lines of circuits in the peripheral area.

2. The array substrate according to claim 1, wherein the peripheral area comprises a main routing area; in the main routing area, the source-drain material lines and the first metal lines do not have any overlapping area, and the gate electrode material lines have overlapping areas with the source-drain material lines and the first metal lines.

3. The array substrate according to claim 2, wherein in the main routing area, the source-drain material lines extend along a direction which is parallel to a direction along which the first metal lines extend; the gate electrode material lines extend along a direction which is perpendicular to the direction along which the first metal lines extend.

4. The array substrate according to claim 3, wherein a gate insulation layer and a passivation layer are disposed in the peripheral area of the array substrate;

the gate insulation layer and the passivation layer are disposed between a gate routing layer in which the gate electrode material lines are disposed and a metal routing layer in which the first metal lines are disposed.

5. The array substrate according to claim 4, wherein the gate insulation layer is disposed between the gate routing layer and a source-drain routing layer in which the source-drain material lines are disposed.

6. The array substrate according to claim 5, wherein thin film transistors are disposed in the peripheral area of the array substrate;

the first metal lines are electrically connected with gate electrodes, source electrodes or drain electrodes of the thin film transistors.

7. The array substrate according to claim 6, wherein via holes are formed in the gate insulation layer and the passivation layer; the first metal lines and the gate electrodes of the thin film transistors are electrically connected through the via holes.

8. The array substrate according to claim 6, wherein the gate electrode material lines are in a same layer as the gate electrodes of the thin film transistors, and the source-drain material lines are in a same layer as the source electrodes or the drain electrodes of the thin film transistors.

9. The array substrate according to claim 2, wherein a gate insulation layer and a passivation layer are disposed in the peripheral area of the array substrate;

the gate insulation layer and the passivation layer are disposed between a gate routing layer in which the gate electrode material lines are disposed and a metal routing layer in which the first metal lines are disposed.

10. The array substrate according to claim 9, wherein the gate insulation layer is disposed between the gate routing layer and a source-drain routing layer in which the source-drain material lines are disposed.

11. The array substrate according to claim 10, wherein thin film transistors are disposed in the peripheral area of the array substrate;

the first metal lines are electrically connected with gate electrodes, source electrodes or drain electrodes of the thin film transistors.

12. The array substrate according to claim 11, wherein via holes are formed in the gate insulation layer and the passivation layer; the first metal lines and the gate electrodes of the thin film transistors are electrically connected through the via holes.

13. The array substrate according to claim 11, wherein the gate electrode material lines are in a same layer as the gate electrodes of the thin film transistors, and the source-drain material lines are in a same layer as the source electrodes or the drain electrodes of the thin film transistors.

14. The array substrate according to claim 1, wherein a gate insulation layer and a passivation layer are disposed in the peripheral area of the array substrate;

the gate insulation layer and the passivation layer are disposed between a gate routing layer in which the gate electrode material lines are disposed and a metal routing layer in which the first metal lines are disposed.

15. The array substrate according to claim 14, wherein the gate insulation layer is disposed between the gate routing layer and a source-drain routing layer in which the source-drain material lines are disposed.

16. The array substrate according to claim 15, wherein thin film transistors are disposed in the peripheral area of the array substrate;

the first metal lines are electrically connected with gate electrodes, source electrodes or drain electrodes of the thin film transistors.

17. The array substrate according to claim 16, wherein via holes are formed in the gate insulation layer and the passivation layer; the first metal lines and the gate electrodes of the thin film transistors are electrically connected through the via holes.

18. The array substrate according to claim 16, wherein the gate electrode material lines are in a same layer as the gate electrodes of the thin film transistors, and the source-drain material lines are in a same layer as the source electrodes or the drain electrodes of the thin film transistors.

19. The array substrate according to claim 1, wherein a common electrode and a conducting structure that is disposed above the common electrode and is electrically connected with the common electrode are disposed in a display area of the array substrate; the conducting structure and the first metal lines are disposed in a same layer and are formed in a same process.

20. A display device comprising the array substrate according to claim 1.

* * * * *